United States Patent
Gao

(10) Patent No.: US 10,593,904 B2
(45) Date of Patent: Mar. 17, 2020

(54) ORGANIC-LIGHT EMITTING DIODE DEVICE AND METHOD FOR FABRICATING THE SAME

(71) Applicant: BOE TECHNOLOGY GROUP CO., LTD, Beijing (CN)

(72) Inventor: Xinwei Gao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 102 days.

(21) Appl. No.: 15/509,915

(22) PCT Filed: Aug. 15, 2016

(86) PCT No.: PCT/CN2016/095260
§ 371 (c)(1),
(2) Date: Mar. 9, 2017

(87) PCT Pub. No.: WO2017/161799
PCT Pub. Date: Sep. 28, 2017

(65) Prior Publication Data
US 2018/0182996 A1   Jun. 28, 2018

(30) Foreign Application Priority Data
Mar. 24, 2016   (CN) .......................... 2016 1 0173332

(51) Int. Cl.
*H01L 51/52* (2006.01)
*H01L 27/32* (2006.01)

(52) U.S. Cl.
CPC ........ *H01L 51/5212* (2013.01); *H01L 27/326* (2013.01); *H01L 51/5218* (2013.01); *H01L 51/5234* (2013.01); *H01L 2251/5323* (2013.01)

(58) Field of Classification Search
None
See application file for complete search history.

(56) References Cited

U.S. PATENT DOCUMENTS

| 7,679,093 B2* | 3/2010 | Park ..................... G09G 3/3233 257/40 |
| 8,104,895 B2 | 1/2012 | Quach |

(Continued)

FOREIGN PATENT DOCUMENTS

| CN | 1784101 A | 6/2006 |
| CN | 1816228 A | 8/2006 |

(Continued)

OTHER PUBLICATIONS

State Intellectual Property Office of the P.R.C (SIPO) Office Action 1 for 201610173332.9 dated Mar. 3, 2017 11 Pages.

(Continued)

*Primary Examiner* — Tuan A Hoang
(74) *Attorney, Agent, or Firm* — Westerman, Hattori, Daniels & Adrian, LLP

(57) ABSTRACT

The present application discloses an organic light-emitting diode (OLED) device, including: a transparent substrate, a first electrode structure, an organic light-emitting layer, and a second electrode structure. The first electrode structure comprises a plurality of first electrodes and second electrodes on the transparent substrate, a first electrode and a second electrode each corresponding to a subpixel unit, the first electrodes and the second electrodes being arranged in an alternating configuration along at least one of a row direction and a column direction of a pixel unit. The second electrode structure comprises a transparent electrode layer with a planar structure, the second electrode structure being on the organic light-emitting layer. The organic light-emitting layer is between the first electrode structure and the second electrode structure. A light-transmission rate of the first electrodes is higher than a light-transmission rate of the second electrode structure.

8 Claims, 2 Drawing Sheets

(56) References Cited

U.S. PATENT DOCUMENTS

| | | | |
|---|---|---|---|
| 8,431,930 B2 | 4/2013 | Park | |
| 8,618,727 B2* | 12/2013 | Goldmann | H01L 51/5271 |
| | | | 313/503 |
| 2006/0066229 A1 | 3/2006 | Nimura | |
| 2007/0045620 A1 | 3/2007 | Park et al. | |
| 2011/0121346 A1* | 5/2011 | Yamada | H01L 51/5234 |
| | | | 257/98 |
| 2011/0205198 A1* | 8/2011 | Jeong | H01L 27/326 |
| | | | 345/205 |
| 2012/0098737 A1 | 4/2012 | Kim et al. | |

FOREIGN PATENT DOCUMENTS

| | | |
|---|---|---|
| CN | 1901218 A | 1/2007 |
| CN | 100477326 C | 4/2009 |
| CN | 102169886 A | 8/2011 |
| CN | 103345884 A | 10/2013 |
| CN | 103730484 A | 4/2014 |
| CN | 104391406 A | 3/2015 |
| CN | 104701351 A | 6/2015 |
| CN | 105633292 A | 6/2016 |
| EP | 3091578 A1 | 11/2016 |
| TW | I331479 B | 10/2010 |
| WO | 2015/101258 A1 | 7/2015 |

OTHER PUBLICATIONS

The World Intellectual Property Organization (WIPO) International Search Report and Written Opinion for PCT/CN2016/095260 dated Dec. 26, 2016 13 Pages.

Extended (Supplementary) European Search Report dated Oct. 18, 2019, issued in counterpart application No. 16845340.5. (8 pages).

* cited by examiner

ORGANIC-LIGHT EMITTING DIODE DEVICE AND METHOD FOR FABRICATING THE SAME

CROSS-REFERENCE TO RELATED APPLICATION

This application is a national phase entry under 35 U.S.C. § of International Application No. PCT/CN2016/095260, filed on Aug. 15, 2016, which claims priority of Chinese Patent Application No. 201610173332.9, filed on Mar. 4, 2016. The above enumerated patent applications are incorporated by reference herein in their entirety.

TECHNICAL FIELD

The present invention relates to display technology, more particularly, to an organic light-emitting diode (OLED) device and a method for fabricating the OLED device.

BACKGROUND

Often, an organic light-emitting diode (OLED) device has a sandwich-like structure, which includes an organic material layer disposed between an anode and a cathode. The organic material layer often includes a hole injection layer, a hole transport layer, a light-emitting layer, an electron transport layer, an electron injection layer, etc. An OLED device is a type of electrical-injection device. After applying an operating voltage between the anode and the cathode, holes are injected from the anode into the organic material layer and electrons are injected from the cathode into the organic material layer. The carriers, i.e., holes and electrons, form hole-electron pairs in the organic material layer. The hole-electron pairs then recombine to emit light.

Recently, transparent display technology has applications in window displays, instruments, devices, and other related fields.

SUMMARY

In one aspect, the present invention provides an organic light-emitting diode (OLED) device, including: a transparent substrate, a first electrode structure, an organic light-emitting layer, and a second electrode structure. The first electrode structure comprises a plurality of first electrodes and second electrodes on the transparent substrate, a first electrode and a second electrode each corresponding to a subpixel unit, the first electrodes and the second electrodes being arranged in an alternating configuration along at least one of a row direction and a column direction of a pixel unit. The second electrode structure comprises a transparent electrode layer with a planar structure, the second electrode structure being on the organic light-emitting layer. The organic light-emitting layer is between the first electrode structure and the second electrode structure. A light-transmission rate of the first electrodes is higher than a light-transmission rate of the second electrode structure, a light-reflection rate of the first electrodes is lower than a light-reflection rate of the second electrode structure, a light-transmission rate of the second electrodes is lower than the light-transmission rate of the second electrode structure, and a light-reflection rate of the second electrodes is higher than the light-reflection rate of the second electrode structure.

Optionally, the second electrodes are transparent electrodes.

Optionally, the light-reflection rate of the first electrodes is lower than the light-reflection rate of the second electrode structure by at least 5%, and the light-reflection rate of the second electrode structure is lower than the light-reflection rate of the second electrodes by at least 5%.

Optionally, the second electrodes are opaque electrodes.

Optionally, the light-reflection rate of the first electrodes is lower than the light-reflection rate of the second electrode structure by at least 5%.

Optionally, the first electrode structure is an anode structure and the second electrode structure is a cathode structure.

Optionally, the first electrodes are made of one or more of indium tin oxide (ITO), indium zinc oxide (IZO), nano-silver, conductive polymers, carbon nanotubes, graphene, electrospun nano-copper fibers, and printed metal grid; and the second electrodes are made of one or more of indium tin oxide (ITO), indium zinc oxide (IZO), nano-silver, conductive polymers, carbon nanotubes, graphene, electrospun nano-copper fibers, and printed metal grid.

Optionally, the transparent substrate is made of one or more of copolymers, mixtures, and laminates formed from one or more of glass, polyolefin, polyetherketone, polyimide, polyethylene terephthalate, polyacrylate, silicone, polyethylene glass resin, polycarbonate, fluoropolymers, and polyester.

Optionally, the second electrode structure is made of one or more of MgAg alloy, Ag, ITO, IZO, and graphene.

Optionally, the OLED device further includes a packaging cover on the second electrode structure on a side facing away from the transparent substrate.

Another aspect of the present disclosure provides a method for forming an organic light-emitting diode (OLED) device, including: forming a first electrode structure on a transparent substrate, the first electrode structure comprising a plurality of first electrodes and a plurality of second electrodes, a first electrode and a second electrode each corresponding to a subpixel unit, the first electrodes and the second electrodes being arranged in an alternating configuration along at least one of a row direction and a column direction of a pixel unit; forming an organic light-emitting layer on the first electrode structure; and forming a second electrode structure on the organic light-emitting layer, the second electrode structure being a transparent electrode layer with a planar structure.

Optionally, the first electrode structure is formed by one or more of sputtering, electron beam vapor deposition, sputtering, baking, and photolithography processes.

Optionally, the organic light-emitting layer is formed by a vapor deposition process.

Optionally, the second electrode structure is formed by one or more of thermal evaporation deposition, electron beam vapor deposition, and sputtering processes.

Optionally, the method further includes forming a packaging cover on the second electrode structure.

Optionally, the packaging cover includes one or more of a glass packaging cover, a bonding packaging pattern, a thin-film packaging pattern, and a dam-and-film packaging pattern.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

A conventional OLED device often do not have transparent display functions and two-sided independent display functions at the same time.

Unless specified, the in the present disclosure, the terms "first". "second", and the alike are merely used for illustrative purposes, e.g., for distinguishing different parts of an object. These terms do not infer or indicate any order or any differences in composition, location, and direction. The phrases such as "an electrode corresponding to a subpixel unit", "a portion of a layer corresponding to a subpixel unit/electrode", and alike are used to indicate an object and the corresponding object correspond to each other in space or location. For example, an electrode corresponding to a subpixel unit refers to that the orthogonal projection of the subpixel unit and the orthogonal projection of the electrode at least partially overlap along a direction perpendicular to substrate. In some embodiments, the orthogonal projection of the subpixel unit and the orthogonal projection of the electrode may fully overlap along a direction perpendicular to substrate. It should be noted that, the specific meanings of these phrases should be subjected to different context and should not be limited by the examples herein.

Figure 1:
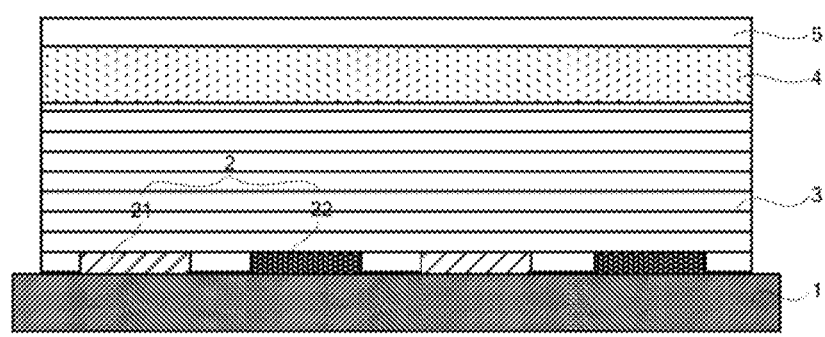
FIG. 1 illustrates a cross-sectional view of an exemplary OLED device according to some embodiments of the present disclosure.
Figure 2:
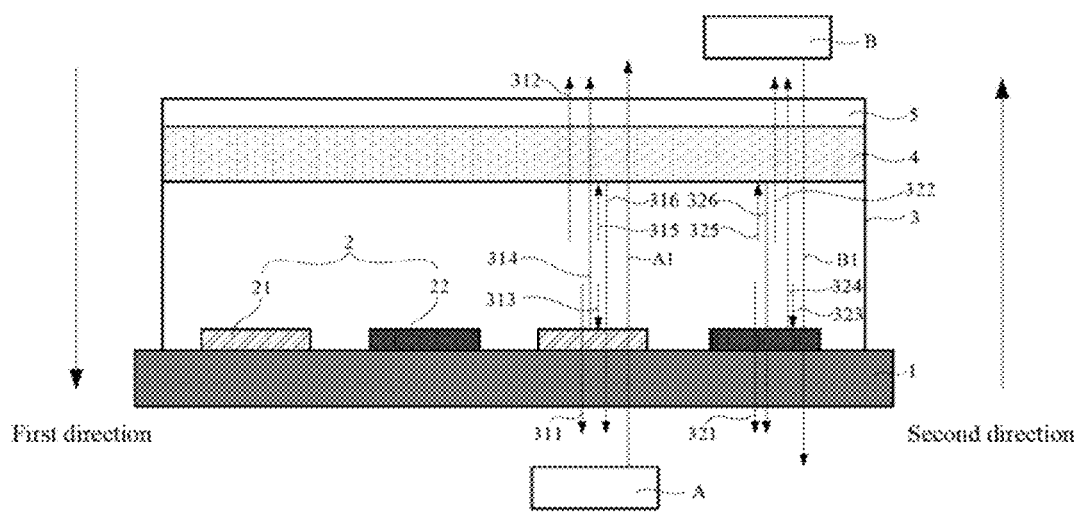
FIG. 2 illustrates working principles of an OLED device according to some embodiments of the present disclosure.
Figure 3:
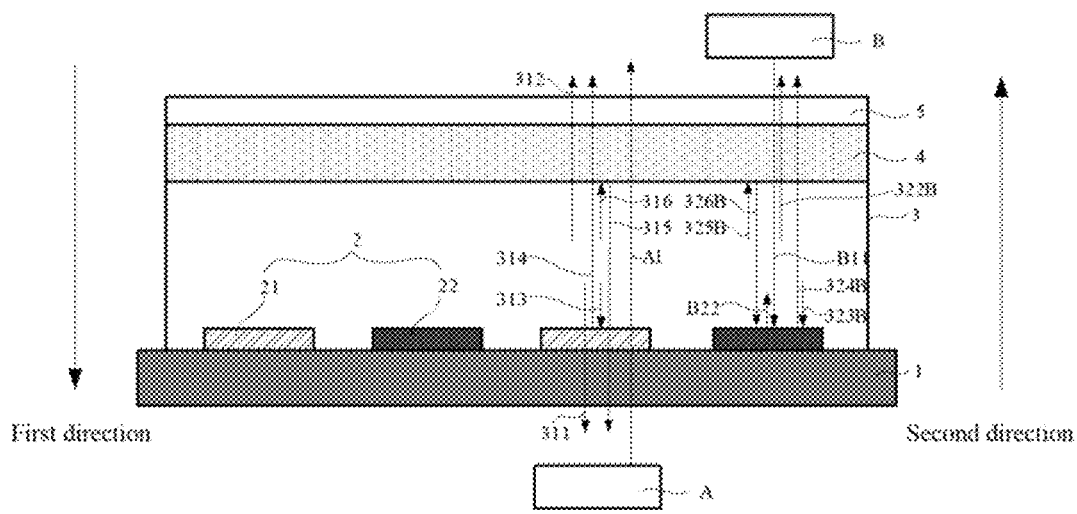
FIG. 3 illustrates a cross-sectional view of another exemplary OLED device according to some embodiments of the present disclosure.

The present invention provides an organic light-emitting diode (OLED) device that has a transparent display and two-sided independent display. The OLED device includes a transparent substrate, a first electrode structure, an organic light-emitting layer, and a second electrode structure. The first electrode structure comprises a plurality of first electrodes, element 21 in FIGS. 1-3, a first electrode corresponding to a subpixel unit, the first electrodes being arranged along at least one of a row direction and a column direction of a pixel unit, the first electrode structure being on the transparent substrate. The second electrode structure includes a transparent electrode layer with a planar structure, the second electrode structure being on the organic light-emitting layer. The organic light-emitting layer is sandwiched between the first electrode structure and the second electrode structure, as shown in FIGS. 1-3. A light-transmission rate of the first electrodes is higher than a light-transmission rate of the second electrode structure, and a light-reflection rate of the first electrodes is lower than a light-reflection rate of the second electrode structure.

In some embodiments, the first electrode structure further includes a plurality of second electrodes, e.g., element 22 in FIGS. 1-3, a second electrode corresponding to a subpixel unit (not shown), the first electrodes and the second electrodes being arranged in an alternating configuration along at least one of a row direction and a column direction of a pixel unit, as shown in FIGS. 1-3. The row direction or the column direction of a pixel unit refers to the directions of the subpixels that are aligned in the pixel unit. A light-transmission rate of the second electrodes is lower than the light-transmission rate of the second electrode structure, and a light-reflection rate of the second electrodes is higher than the light-reflection rate of the second electrode structure.

In some embodiments, the second electrodes are transparent electrodes. In this case, the light-reflection rate of the first electrodes may be lower than the light-reflection rate of the second electrode structure by at least 5%, and the light-reflection rate of the second electrode structure may be lower than the light-reflection rate of the second electrodes by at least 5%.

In some embodiments, the second electrodes are opaque electrodes. In this case, the light-reflection rate of the first electrodes may be lower than the light-reflection rate of the second electrode structure by at least 5%.

In some embodiments, the first electrode structure is an anode structure and the second electrode structure is a cathode structure.

In some embodiments, the first electrodes are made of one or more of indium tin oxide (ITO), indium zinc oxide (IZO), nano-silver, conductive polymers, carbon nanotubes, graphene, electrospun nano-copper fibers, and printed metal grid; and the second electrodes are made of one or more of indium tin oxide (ITO), indium zinc oxide (IZO), nano-silver, conductive polymers, carbon nanotubes, graphene, electrospun nano-copper fibers, and printed metal grid. In some embodiments, the transparent substrate is made of one or more of copolymers, mixtures, and laminates formed from one or more of glass, polyolefin, polyetherketone, polyimide, polyethylene terephthalate, polyacrylate, silicone, polyethylene glass resin, polycarbonate, fluoropolymers, and polyester. In some embodiments, the second electrode structure is made of one or more of MgAg alloy, Ag, ITO, IZO, and graphene.

In some embodiments, the OLED device further includes a packaging cover, on the second electrode structure on a side facing away from the transparent substrate.

Another aspect of the present disclosure provides a method for forming an organic light-emitting diode (OLED) device. The method includes forming a first electrode structure on a transparent substrate, the first electrode structure comprising a plurality of first electrodes and a plurality of second electrodes, a first electrode corresponding to a subpixel unit, a second electrode corresponding to a subpixel unit, the first electrodes and the second electrodes being arranged in an alternating configuration along at least one of a row direction and a column direction of a pixel unit; forming an organic light-emitting layer on the first electrode structure; and forming a second electrode structure on the organic light-emitting layer, the second electrode structure being a transparent electrode layer with a planar structure.

In some embodiments, the first electrode structure is formed by one or more of sputtering, electron beam vapor deposition, sputtering, baking, and photolithography processes. In some embodiments, the organic light-emitting layer is formed by a vapor deposition process. In some embodiments, the second electrode structure is formed by one or more of thermal evaporation deposition, electron beam vapor deposition, and sputtering processes.

In some embodiments, the method further includes forming a packaging cover on the second electrode structure. The packaging cover may be formed on the second electrode structure on a side facing away from the transparent substrate. In some embodiments, the packaging cover includes one or more of a glass packaging cover, a bonding packaging pattern, a thin-film packaging pattern, and a dam-and-film packaging pattern.

The present disclosure provides an OLED device and a method for fabricating the OLED device. The OLED device may be configured to have a transparent display and two-sided independent display at the same time.

As shown in FIGS. 1-3, embodiments of the present disclosure provide an OLED device. The OLED device may include a substrate 1, a first electrode structure 2 formed on the substrate 1, an organic light-emitting layer 3 formed on the first electrode structure 2, and a second electrode structure 4 formed on the organic light-emitting layer 3. The first electrode structure 2 may include a plurality of first electrodes 21 and a plurality of second electrodes 22. A first electrode 21 may correspond to a subpixel unit of the OLED device, and a second electrode 22 may correspond to a subpixel unit of the OLED device. The subpixel units in pixel unit of the OLED device may be arranged in an array and may be arranged repeatedly along a row direction and a column direction. Along a row direction and/or a column direction of a pixel unit, the first electrodes 21 and the second electrodes 22 may be arranged in an alternating configuration. For example, a first electrode 21 may be arranged between two second electrodes 22, and vice versa. The second electrode structure 4 may be a transparent electrode layer with a planar structure. The light-transmission rate of a first electrode 21 may be higher than the light-transmission rate of the second electrode structure 4. The light-reflection rate of a first electrode 21 may be lower than the light-reflection rate of the second electrode structure 4. The light-transmission rate of a second electrode 22 may be lower than the light-transmission rate of the second electrode structure 4. The light-reflection rate of a second electrode 22 may be higher than the light-reflection rate of the second electrode structure 4.

In operation, as shown in FIGS. 2 and 3, the portion of the organic light-emitting layer 3 corresponding to a first electrode 21 and the portion of the organic light-emitting layer 3 corresponding to a second electrode 22 may be turned on at the same time or at different times. That is, the portion of the organic light-emitting layer 3 corresponding to a first electrode 21 and the portion of the organic light-emitting layer 3 corresponding to a second electrode 22 may function separately or together. To illustrate the disclosure, in FIGS. 2 and 3, portions of the organic light-emitting layer 3 corresponding to the first electrodes 21 and portions of the organic light-emitting layer 3 corresponding to the second electrodes 22 may be turned on at the same time to implement two-sided independent display.

As shown in FIG. 2, when the portions of the organic light-emitting layer 3 corresponding to the first electrodes 21, are turned on to emit light, images may be formed by the subpixel units corresponding to the first electrodes 21 under the illumination of the organic light-emitting layer 3. Because the light-transmission rate of the first electrodes 21 is higher than the light-transmission rate of the second electrode structure 4 and the light-reflection rate of the first electrodes 21 is lower than the light-reflection rate of the second electrode structure 4, the amount of light, emitted by the light-emitting layer 3 and transmitting through the first electrodes 21, may be more than the amount of light emitted by the organic light-emitting layer 3 and transmitting through the second electrodes 4. The light emitted by the light-transmitting layer 3 and transmitting through the first electrodes 21 may be denoted as light/element 311. The light emitted by the light-transmitting layer 3 and transmitting through the second electrode structure 4 may be denoted as light/element 312. The brightness level on the side of the first electrodes 21. i.e., formed by the transmission of light 311, may be higher than the brightness level on the side of the second electrode structure 4, i.e., formed by the transmission of light 312.

A portion of the light emitted by the organic light-emitting layer 3, denoted as element 313, may be reflected by the first electrodes 21 to generate or form the first reflected light 314. Meanwhile, another portion of the light emitted by the organic light-emitting layer 3, denoted as element 315, may be reflected by the second electrode structure 4 to generate the second reflected light 316. The amount of the second reflected light 316 reflected by the second electrode structure 4 may be more than the amount of the first reflected light 314 reflected by the first electrodes 21. When a user is on the side of the second electrode structure 4 and viewing from the side of the second electrode structure 4 to the first electrodes 21, i.e., along the first direction shown in FIG. 2, mirror effect may occur in the OLED device That is, because the light-transmission rate of a first electrode 21 is higher than the light-transmission rate of the second electrode structure 4 and the light-reflection rate of a first electrode 21 is lower than the light-reflection rate of the second electrode structure 4, the intensity of light exiting from the second electrode structure 4 corresponding to the second electrodes 22 may be sufficiently higher than the intensity of light exiting from the second electrode structure 4 corresponding to the first electrodes 21, that the user may only see the images displayed by the portions of the organic light-emitting layer 3 corresponding to the second electrodes 22.

As such, the user may only be able to see the images formed by the subpixel units corresponding to the first electrodes 21 from the side of the first electrodes 21. That is, the user may only be able to see the images through the light 311 transmitted through the first electrodes 21. Meanwhile, the user may also be able to see the background or scene A through the OLED device from the side of the second electrode structure 4, along the first direction. The background A is on the side of the transparent substrate 1 facing away from the second electrode structure 4. That is, the OLED device may transparently display scene A through light A1. Light A1 represents the light emitted or reflected by the background A and transmitting through the OLED device to the user's eyes. Transparent display of scene A may thus be implemented.

The second electrodes 22 may be transparent or opaque. The working mechanisms of the OLED device with transparent and opaque second electrodes 22 are illustrated in FIGS. 2 and 3, respectively.

When the second electrodes 22 are transparent electrodes, as shown in FIG. 2, and the portions of the organic light-emitting layer 3 corresponding to the second electrodes 22, are turned on to emit light, the subpixel units corresponding to the second electrodes 22 may display images under the illumination of the organic light-emitting layer 3. Because the light-transmission rate of the second electrodes 22 is lower than the light-transmission rate of the second electrode structure 4 and the light-reflection rate of the second electrodes 22 is higher than the light-reflection rate of the second electrode structure 4, the amount of light 322 emitted by the organic light-emitting layer 3 and transmitting through the second electrode structure 4 may be more than the amount of light 321 emitted by the organic light-emitting layer 3 and transmitting through the second electrodes 22.

Accordingly, the brightness level of the light 322 at the side of the second electrode structure 4 may be higher than the brightness level of the light 321 at the side of the second electrodes 22. A portion of the light emitted by the organic light-emitting layer 3, denoted as light 323, may undergo a reflection at the second electrodes 22. The reflected light, generated by the reflection of light 323 at the second electrodes 22, may be denoted as the third reflected light 324. Another portion of the light emitted by the organic light-emitting layer 3 and denoted as light 325, may undergo a reflection at the second electrode structure 4. The reflected light, generated by the reflection of light 325 at the second electrode structure 4, may be denoted as the fourth reflected light 326. The amount of the third reflected light 324 formed at the second electrodes 22 may be more than the amount of the fourth reflected light 326 formed at the second electrode structure 4.

At the same time, when the user is on the side of the second electrodes 22 and viewing from the second electrodes 22 to the second electrode structure 4, i.e., along the second direction shown in FIG. 2, mirror effect may occur in the OLED device. That is, because the light-transmission rate of a second electrode 22 is lower than the light-transmission rate of the second electrode structure 4 and the light-reflection rate of a second electrode 22 is higher than the light-reflection rate of the second electrode structure 4, the intensity of light exiting from the first electrodes 21 may be sufficiently higher than the intensity of light exiting from the second electrodes 22, that the user may only see the images displayed by the portions of the organic light-emitting layer 3 corresponding to the second electrodes 21.

Thus, the user may only be able to see the images displayed by the subpixel units corresponding to the second electrodes 22 when viewing at the side of the second electrode structure 4 along the second direction. That is, the user may see the images displayed by the second electrodes 22 through light 322 passing through the second electrode structure 4. Meanwhile, the user may also see the background or scene B through the OLED device from the side of the second electrodes 22, where the background B is on the side of the second electrode structure 4 facing away from the transparent substrate 1. That is, the OLED device may transparently display scene B through light B1, where light B1 represents the light emitted or reflected by the background B and transmitting through the OLED device to the user's eyes. Transparent display of scene B may be implemented.

In some embodiments, the second electrodes 22 may also be opaque electrodes, as shown in FIG. 3. In this case, when the portions of the organic light-emitting layer 3 corresponding to the second electrodes 22 are turned on to emit light, subpixel units corresponding to the second electrodes 22 may display images under the illumination of the organic light-emitting layer 3. The second electrodes 22 may be opaque electrodes and the light-reflection rate of the second electrodes 22 may be higher than the light-reflection rate of the second electrode structure 4. A portion of the light emitted by the organic light-emitting layer 3 and transmitting towards the second electrode structure 4, denoted as light 322B, may transmit through the second electrode structure 4. Another portion of the light emitted by the organic light-emitting layer 3 and transmitting towards the second electrode structure 4, denoted as light 325B, may undergo a reflection at the second electrode structure 4. The reflected light formed by the reflection of light 325B may be the fourth reflected light 326B.

As a result, light emitted by the organic light-emitting layer 3 and transmitting towards the second electrodes 22 may not transmit through the second electrodes 22. The light emitted by the organic light-emitting layer 3 and transmitting towards the second electrodes 22, denoted as light 323B, may undergo a reflection at the second electrodes 22. The reflected light formed by the reflection of light 323B may be the third reflected light 324B. The amount of the third reflected light 324B formed at the second electrodes 22 may be more than the amount of the fourth reflected light 326B formed at the second electrode structure 4.

In this case, the brightness level at the side of the second electrodes 22 may be lower than the brightness level of light 322B at the side of the second electrode structure 4. When the user is at the side of the second electrode structure 4 and viewing from the second electrode structure 4 to the second electrodes 22, i.e., along the first direction, mirror effect may occur in the OLED device. That is, the light-transmission rate of a second electrode 22 is lower than the light-transmission rate of the second electrode structure 4 and the light-reflection rate of a second electrode 22 is higher than the light-reflection rate of the second electrode structure 4, the intensity of light exiting from the second electrode structure 4 corresponding to the second electrodes 22 may be sufficiently higher than the intensity of light exiting from the second electrode structure 4 corresponding to the first electrodes 21, that the user may only see the images displayed by the portions of the organic light-emitting layer 3 corresponding to the second electrodes 22. Thus, the user may only be able to see the images displayed by the subpixel units corresponding to the second electrodes 22 at the side of the second electrode structure 4. That is, the user may see the images through light 322B. Meanwhile, the second electrodes 22 may block light 323B emitted by the organic light-emitting layer 3 and light B11 emitted or reflected by the background B. A portion of light 323B may undergo a reflection at the second electrodes 22. The reflected portion of light 323B may be denoted as the fifth reflected light B22. Accordingly, when at the side of the second electrodes 22 and viewing along the second direction, the user may not be able to see the background B that is on the side of the second electrode structure 4 facing away from the second electrodes 22. However, the OLED device may still implement transparent display through the subpixel units corresponding to the first electrodes 21.

In some certain embodiments, the relationship among the light-transmission rates and the light-reflection rates of the first electrodes 21, the second electrodes 22, and the second electrode structure 4 may be adjusted such that when the user is at the side of the second electrode structure 4 and viewing along the first direction, the user may see the images displayed by the portions of the organic light-emitting layer 3 corresponding to the first electrodes 21 and portions of the organic light-emitting layer 3 corresponding to the second electrodes 22 at the same time. In this case, the user may not be able to see the background A. When the second electrodes 22 are transparent and the user is at the side of the first electrode structure 2, viewing along the second direction, the user may see the images displayed by the portions of the organic light-emitting layer 3 corresponding to the first electrodes 21 and portions of the organic light-emitting layer 3 corresponding to the second electrodes 22 at the same time. In this case, the user may not be able to see the background B.

Thus, when the first electrodes 21 are controlled to turn on the portions of the organic light-emitting layer 3 corresponding to the first electrodes 21, the user, at the side of the first electrodes 21 and viewing along the second direction, may be able to view the images displayed by the subpixel units corresponding to the first electrodes 21. Meanwhile, when at the side of the second electrode structure 4 and viewing along the first direction, the user may also be able to see the background or scene on the side of the transparent substrate 1 facing away from the second electrode structure 4, e.g., background A. Accordingly, transparent display may be implemented.

When the second electrodes 22 are controlled to turn on the portions of the organic light-transmitting layer 3 corresponding to the second electrodes 22. The user, at the side of the second electrode structure 4 and viewing along the first direction, may be able to see the images displayed by the subpixel corresponding to the second electrodes 22.

That is, when the portions of the organic light-emitting layer 3 corresponding to the first electrodes 21 and the second electrodes 22 are turned on and the second electrodes 22 are transparent, the OLED device may display images and implement transparent display on both sides, i.e., viewing along the first direction and the second direction. When the portions of the organic light-emitting layer 3 corresponding to the first electrodes 21 and the second electrodes 22 are turned on and the second electrodes 22 are opaque, the OLED device may display images on both sides and implement transparent display on only one side, i.e., viewing along the first direction. Thus, by controlling the first electrodes 21 and the second electrodes 22, the OLED device may implement transparent display and two-sided independent display at the same time.

The area of a first electrode 21 and a second electrode 22 may be determined according to different applications and designs. In some embodiments, the OLED device may be divided into a plurality of display regions. By controlling the number and the on/off states of the first electrodes 21 and the second electrodes 22 in a display region, each region may display images and provide transparent display at least form one side. The images displayed by one display region may be different from or same as the images displayed by another display region.

In certain embodiments, in an OLED device, some of the second electrodes 22 are transparent and some of the second electrodes 22 are opaque. In this case, when the user is at the side of the second electrode structure 4 and viewing along the first direction, the user may be able to see images display by the portions of the organic light-emitting layer 3 corresponding to the second electrodes 22. The user may also see the background A. When the user is at the side of the first electrodes structure 2 and viewing along the second direction, the user may be able to see images display by the portions of the organic light-emitting layer 3 corresponding to the first electrodes 21. The user may also see the background B through some transparent second electrodes 22.

In some embodiments, the first electrodes 21 and the second electrodes 22 may be anodes of the OLED device, and the second electrode structure 4 may be a transparent cathode of the OLED device. Depending on different embodiments, the second electrodes 22 may be transparent anodes or opaque anodes of the OLED device.

Specifically, when fabricating the disclosed OLED device, the first electrodes 21 may be made of one or more of indium tin oxide (ITO), indium zinc oxide (IZO), nano-silver, conductive polymers, carbon nanotubes, graphene, electrospun nano-copper fibers, and printed metal grid.

The second electrodes 22 may also be made of one or more of indium tin oxide (ITO), indium zinc oxide (IZO), nano-silver, conductive polymers, carbon nanotubes, graphene, electrospun nano-copper fibers, and printed metal grid.

The second electrode structure 4 may be made of one or more of MgAl alloy, Ag, ITO, IZO, and graphene.

The transparent substrate 1 may be made of one or more of copolymers, mixtures, and laminates formed from glass, polyolefin, polyetherketone, polyimide, polyethylene terephthalate, polyacrylate, silicone, polyethylene glass resin, polycarbonate, fluoropolymers, and polyester.

To improve the display effect of the transparent display, when the second electrodes 22 are transparent electrodes, the light-reflection rate of the first electrodes 21 may be lower than the light-reflection rate of the second electrode structure 4 by at least 5%, and the light-reflection rate of the second electrode structure 4 may be lower than the light-reflection rate of the second electrodes 22 by at least 5%. When the second electrodes 22 are opaque electrodes, the light-reflection rate of the first electrodes 21 may be lower than the light-reflection rate of the second electrode structure 4 by at least 5%.

To provide protection to the OLED device, and prevent the second electrode structure 4 of the OLED device from contacting the moisture and oxygen in the air, the OLED device may further include a packaging cover. As shown in FIGS. 1-3, the packaging cover 5 may be mounted or disposed on the second electrode structure 4 at the side that is facing away from the transparent substrate 1. The packaging cover 5 may prevent the contact and possible chemical reaction between the second electrode structure 4 and the moisture and oxygen in the air, so as to increase the service time of the OLED device.

Another aspect of the present disclosure provides a method for fabricating the OLED device.

Figure 4:
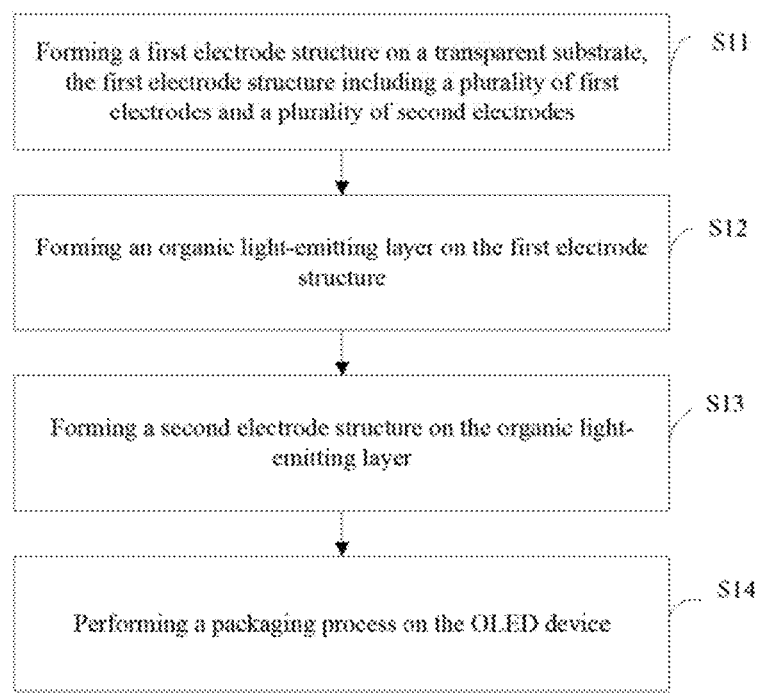
FIG. 4 illustrates an exemplary process flow for fabricating an OLED device according to some embodiments of the present disclosure.

FIG. 4 illustrates a process flow of the disclosed method. As shown in FIG. 4, the method may include steps S11-S14.

In step S11, a first electrode structure 2 may be formed on a transparent substrate 1. The first electrode structure 2 may include a plurality of first electrodes 21 and a plurality of second electrodes 22. Each first electrode 21 may correspond to a subpixel unit of the OLED device, and each second electrode 22 may correspond to a subpixel unit of the OLED device. Along the row direction and/or column direction of the pixel units, the first electrodes 21 and the second electrodes 22 may be arranged in an alternating configuration. For example, one first electrode 21 may be arranged between two second electrodes 22, and vice versa.

In step S12, an organic light-emitting layer 3 may be formed on the first electrode structure 2.

In step S13, a second electrode structure 4 may be formed on the organic light-emitting layer 3. The second electrode structure 4 may be a transparent electrode layer with a planar structure.

In some embodiments, when forming the first electrode structure 2 on the transparent substrate 1 in step S11, the first electrodes 21 and the second electrodes 22 of the first electrode structure 2 may be formed through one or more of sputtering, electron beam vapor deposition, spin coating, baking, and photolithography. Any other suitable deposition processes may also be used to form the first electrode structure 2.

In some embodiments, when forming the organic light-emitting layer 3 on the first electrode structure 2 in step S12, the organic light-emitting layer 3 may be formed through a suitable vapor deposition process or any other proper deposition processes.

In some embodiments, when forming the second electrode structure 4 on the organic light-emitting layer 3 in step S13, the second electrode structure 4 may be formed through one or more of thermal evaporation deposition, electron beam vapor deposition, and sputtering. Any other suitable deposition processes may also be used to form the second electrode structure 4.

In some embodiments, the method may further include a step S14. In step S14, after the second electrode structure 4 is formed on the organic light-emitting layer 3, a packaging process may be performed on the OLED device. For example, in some embodiments, a packaging cover may be formed on the second electrode structure 4.

In some embodiments, the packaging process in step S14 may include packaging the OLED device with a packaging cover. The packaging cover may include one or more of a glass packaging cover, a bonding packaging pattern, a thin-film packaging pattern, and a dam-and-fill packaging pattern. Any other suitable packaging processes may also be used to package the OLED device.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light-emitting diode (OLED) device, comprising: a transparent substrate, a first electrode structure, an organic light-emitting layer, and a second electrode structure, wherein:

the first electrode structure comprises a plurality of first electrodes and a plurality of second electrodes on the transparent substrate, each of the plurality of first electrodes and the plurality of second electrodes is in one to one correspondence with a subpixel unit, the plurality of first electrodes and the plurality of second electrodes being separated from one another in an alternating configuration along at least one of a row direction and a column direction of a pixel unit; the second electrode structure comprises a transparent electrode layer with a planar structure, the second electrode structure being on the organic light-emitting layer;

the organic light-emitting layer is between the first electrode structure and the second electrode structure;

a light-transmission rate of each of the plurality of first electrodes is higher than a light-transmission rate of the second electrode structure, a light-reflection rate of each of the plurality of first electrodes is lower than a light-reflection rate of the second electrode structure, a light-transmission rate of each of the second plurality of electrodes is lower than the light-transmission rate of the second electrode structure, and a light-reflection rate of each of the plurality of second electrodes is higher than the light-reflection rate of the second electrode structure; and the plurality of second electrodes are transparent electrodes.

2. The OLED device according to claim 1, wherein the light-reflection rate of the first electrodes is lower than the light-reflection rate of the second electrode structure by at least 5%, and the light-reflection rate of the second electrode structure is lower than the light-reflection rate of the second electrodes by at least 5%.

3. The OLED device according to claim 1, wherein the first electrode structure is an anode structure and the second electrode structure is a cathode structure.

4. The OLED device according to claim 1, wherein: the first electrodes are made of one or more of indium tin oxide (ITO), indium zinc oxide (IZO), nano-silver, conductive polymers, carbon nanotubes, graphene, electrospun nano-copper fibers, and printed metal grid; and the second electrodes are made of one or more of indium tin oxide (ITO), indium zinc oxide (IZO), nano-silver, conductive polymers, carbon nanotubes, graphene, electrospun nano-copper fibers, and printed metal grid.

5. The OLED device according to claim 1, wherein the transparent substrate is made of one or more of copolymers, mixtures, and laminates formed from one or more of glass, polyolefin, polyetherketone, polyimide, polyethylene terephthalate, polyacrylate, silicone, polyethylene glass resin, polycarbonate, fluoropolymers, and polyester.

6. The OLED device according to claim 1, wherein the second electrode structure is made of one or more of MgAg alloy, Ag, ITO, IZO, and graphene.

7. The OLED device according to claim 1, further comprising a packaging cover on the second electrode structure on a side facing away from the transparent substrate.

8. The OLED device according to claim 1, wherein the first electrode and the second electrode are separated from each other.

* * * * *